United States Patent [19]

Worns et al.

[11] Patent Number: 4,847,182
[45] Date of Patent: Jul. 11, 1989

[54] METHOD FOR DEVELOPING A PHOTOPOLYMER PRINTING PLATE USING A DEVELOPER COMPRISING TERPENE HYDROCARBONS

[75] Inventors: John R. Worns; Trevor J. Williams, both of Mishawaka, Ind.

[73] Assignee: W. R. Grace & Co., New York, N.Y.

[21] Appl. No.: 92,828

[22] Filed: Sep. 3, 1987

[51] Int. Cl.$^4$ .............................. G03F 7/26; G03C 5/18
[52] U.S. Cl. ..................................... 430/309; 430/525; 430/331
[58] Field of Search ................. 430/309, 302, 331, 325

[56] References Cited

U.S. PATENT DOCUMENTS

| | | | |
|---|---|---|---|
| 4,323,636 | 4/1982 | Chen | 430/271 |
| 4,414,128 | 11/1983 | Goffinet | 252/111 |
| 4,442,302 | 4/1984 | Pohl | 204/159.23 |
| 4,518,677 | 5/1985 | Pohl | 430/306 |
| 4,576,738 | 3/1986 | Colodney et al. | 252/559 |
| 4,597,887 | 7/1986 | Colodney et al. | 252/106 |

FOREIGN PATENT DOCUMENTS 228676 7/1987 European Pat. Off. .

Primary Examiner—Paul R. Michl
Assistant Examiner—Patrick A. Doody
Attorney, Agent, or Firm—John J. Wasatonic; William L. Baker

[57] ABSTRACT

This invention presents terpene-based solvents suitable for use in the processing of a wide variety of photopolymer printing plates. The solvents, which may be terpenes alone, terpenes mixed with organic non-solvents, or terpenes emulsified with water are effective in developing a wide variety of photopolymer printing plates and can produce images superior to those obtained with commercially available solvents currently used in such applications.

26 Claims, No Drawings

METHOD FOR DEVELOPING A PHOTOPOLYMER PRINTING PLATE USING A DEVELOPER COMPRISING TERPENE HYDROCARBONS

FIELD OF INVENTION

This invention relates to the use of terpene class, natural product and blended solvents in flexographic photopolymer printing plates. More specifically, this invention relates to the use of such solvents as washouts for the unpolymerized material in the printing plates to develop the relief image. Such solvents, it has been discovered provide a unique combination of reduced cost, improved plate quality, low volatility, low toxicity and biodegradability.

BACKGROUND OF INVENTION

An essential step to any photopolymeric relief printing process is the development of the printing plate after image formation. Ordinarily, this is accomplished by washing the exposed plate in a solvent which can remove the unpolymerized material while leaving the polymerized (cured) material intact. Since such plates can be formed from a variety of materials, it is necessary to match the specific plates with the appropriate solvent.

For example U.S. Pat. Nos. 4,323,636, 4,323,637, 4,423,135, and 4,369,246 disclose a variety of photopolymer printing plate compositions based on block copolymers of styrene and butadiene (SBS) or isoprene (SIS). These compositions can be utilized to produce printing plates which can be developed by an array of aliphatic and aromatic solvents including methyl ethyl ketone, toluene, xylene, carbon tetrachloride, trichlorethane, methyl chloroform, and tetrachloroethylene. These solvents may be used by themselves or in a mixture with a "non-solvent" (i.e. a material which cannot dissolve unpolymerized materials e.g. trichloroethane with ethanol). In either case, during the development step the solvent can be applied in any convenient manner such as by pouring, immersing, spraying, or roller application. Brushing, which aids in the removal of the unpolymerized or uncrosslinked portions of the composition, can also be performed to facilitate the plate processing.

Similarly, British No. 1,358,062 discloses photosensitive compositions consisting of a nitrile rubber with an addition photopolymerizable tri- or tetra-unsaturated ester derived from acrylic or methacrylic acid combined with an addition polymerization initiator activatable by actinic radiation. Plates made from these compositions are processable by organic solvents including aliphatic esters such as ethyl acetate, aliphatic ketones such as acetone, methyl ethyl ketone or halogenated organic solvents such as methylene chloride, Freon ® and blends of such solvents. Brushing or agitation can be used to facilitate the removal of the non-polymerized portion of composition.

U.S. Pat. No. 4,177,074 discloses a photosensitive composition containing a high molecular weight butadiene/acrylonitrile copolymer which contains carboxyl groups, a low molecular weight butadiene polymer which may or may not contain carboxyl groups, and an ethylenically unsaturated monomer, combined with a free-radical generating system. This composition has use as a flexographic printing plate and requires processing organic solvents including methyl ethyl ketone, benzene, toluene, xylene, trichloroethane, trichlorethylene, methyl chloroform, tetrachloroethylene, or solvent/non-solvent mixtures e.g. tetrachloroethylene and n-butanol. The composition may also be processed with water soluble organic solvents in aqueous basic solution, such as sodium hydroxide/isopropyl alcohol/water; sodium carbonate isopropyl alcohol/water; sodium carbonate/2-butoxyethanol water; sodium borate/2-butoxyethanol/water; sodium silicate/2-butoxyethanol/water; sodium borate/2butoxyethanol/water; sodium silicate/2-butoxyethanol / glycerol/water; and sodium carbonate/2-(2-butoxyethoxy) ethanol/water.

U.S. Pat. No. 4,517,279 discloses a photosensitive composition containing a high molecular weight butadiene acrylonitrile copolymer which contains carboxyl groups, and a high molecular weight butadiene/acrylonitrile copolymer which does not contain carboxyl groups, combined with ethylenically unsaturated monomer and a free radical generating system. This composition, which has use as a flexographic printing plate, requires processing by a tetrachloroethylene solvent in blends of tetrachloroethylene and a non solvent. This composition may also be processed in mixtures of sodiu hydroxide/isopropyl alcohol/water, sodium carbonate/2-butoxyethanol/water, sodium silicate/2-butoxyethanol/water, sodium carbonate / 2-butoxyethanol/glycerol/water and sodium hydroxide/2-(2-butoxyethoxy) tthanol/water.

Thus, the solvents needed for image development will vary depending on the composition of the plate employed. This is quite inconvenient, especially if different photopolymer systems are to be processed at the same facility. Furthermore, many of the solvents used to develop the plates are toxic or suspected carcinogenic materials. Thus, there exists real need for solvent systems which can be used with a higher degree of safety. There exists a need for solvent systems which can be used in a variety of plates.

SUMMARY OF INVENTION

It is an object of this invention to present solvent systems for use with photopolymeric printing plates which overcome the polymer specific problems of previous solvent systems. It is further an object of this invention to present solvent systems which can be used with a wide variety of photopolymeric printing plates, and which present reduced safety problems.

This invention provides solvents for use in the processing of photopolymer printing plates which can be used with a wide variety of photopolymeric materials. The solvents, which are comprised of terpene materials either alone or in the presence of other organic materials (non-solvents), which can be used with SBS and SIS polymer systems, as well as a wide array of nitrile rubber and other copolymer systems. The terpenes, being natural products, also produce low safety hazards. Additionally, since terpenes can be emulsified with water, the solvent system can be an aqueous emulsion to permit a water rinsable system.

DETAILED DESCRIPTION OF INVENTION

This invention presents the terpene-based solvents for use in photopolymer printing plate processing. The terpenes which can be used either alone or in a blended form with nonsolvents such as alcohols, can be used to develop an array of different photopolymer printing plates. A wide variety of terpenes are suitable for use in the solvents of this invention including, but not limited to, alloocimene terpenes, dipentene, d-limonene, l-limonene, alpha pinene, citronellol terpenes, linalool, geraniol, and orange terpenes. Other terpenes may also be useful.

When non-solvents are employed suitable reagents include n-butanol, 2-ethoxyethanol, benzyl alcohol, ethanol, 2-butoxyethanol, isopropyl alcohol, 2-(2-butoxyethoxy) ethanol, mineral oil, mineral spirits, ligroin, decane, octane, and other similar materials. Certain blends, it has been found, promote spontaneous separation of the uncured photopolymer from the wash solution after the plate is developed. This effect, which is quite unexpected, permits repeated use of the reclaimed solvent over extended periods of time, since the amount of uncured polymer remaining in the solvent is quite low.

In fact, this property can be exploited by adding additional non-solvent to the blended terpene/non-solvent system. This additional non-solvent, which can be the same as or different from the one in the blend, will promote spontaneous flocculation and separation of the uncured photopolymer from the blend. The terpene can then be removed by distillation (either steam or vacuum) and the non-solvent can be reclaimed by filtering or screening-out the flocculated uncured photopolymer. If the non-solvent used to achieve this separation was different from the one in the blend, separation of the two non-solvents can be accomplished by distillation.

These terpene-based solvents may be substituted for the synthetic hydrocarbon or halogenated hydrocarbon solvents presently used for processing photopolymer printing plates. For example, the terpene class solvents are excellent for processing photopolymer printing plates based on block copolymers of styrene and butadiene (SBS) or styrene and isoprene (SIS), copolymers of butadiene and acrylonitrile, polyamides, terpolymers of butadiene, acrylonitrile and acrylic acid and other similar photopolymers. The solvents are also useful with polyamide type photopolymer plates which are normally processed in alcohol or water alone. The solvents can also be applied to the plates by any conventional application means including spraying, brushing, dipping (immersing) or any combination thereof.

The terpene-based solvents also, surprisingly, produce photopolymer plates with less cured polymer image swelling than those processed in conventional hydrocarbon or chlorinated hydrocarbon solvents. This permits clear, sharp images to be formed at much lower exposure times than those used when conventional solvents are employed, since swelling tends to distort the image formed.

Additionally, these solvents have fairly low volatilities which reduces worker exposure during the plate processing. Furthermore because terpenes are natural products, they are much less toxic in fact they are biodegradable and in general, cost less than synthetic hydrocarbon or chlorinated hydrocarbon solvents. Terpene-based solvents also lend themselves to recovery by steam or vacuum distillation which permits recovery of the solvents at lower distillation temperatures than conventional solvents. The steam distillation process is also safer than conventional hydrocarbon solvent distillation.

An additional feature of the terpene-based solvents is the ability of terpenes to form emulsions with water. This permits formation of an aqueous mixture that retains all of the processing advantages of the pure terpene solvent. Such a water emulsion, with many plates, produces less swell of the photopolymerized or cross-linked photopolymer image and permits water rinsing of the emulsion from the plate prior to drying the plate at elevated temperature in a drying oven. Water rinsing is not practical when conventional hydrocarbon or chlorinated hydrocarbon solvents are used because of the rinse water will become contaminated with the toxic synthetic solvent; additionally, such solvents are also are insoluble in water.

It is important to remove the wash out solvent from the plate prior to drying because any solvent retained on the plate after processing will increase plate swelling and distortion upon oven drying. Removal of the emulsified wash solvent from the plate by water-rinsing in the present invention prior to oven drying gives reduced swelling and improved plate quality over conventional wash solvents.

Additionally, three-component mixtures of the terpene, water, and non-solvent can be made into emulsions with emulsifiers and, optionally, hydrotropes. This permits the easy recycling of the solvent, since uncured photo-polymer will spontaneously separate from the mixture, allowing it to be easily removed from the system by filtration or screening. This permits repeated use of the solvent without the need for distillation to remove uncured photopolymer.

Useful classes of emulsifiers for forming emulsions of these terpene class solvents with water include sulfosuccinates, in particular sodium dioctyl sulfosuccinate (Aerosol OT-100); polyethylene glycol p-isooctylphenyl ethers (Triton X-100); and polyethylene glycol mono(nonylphenyl) ethers (Triton N-57). Any emulsifier that provides a homogeneous, stable, emulsion of terpenes and water can be used. For the purposes of the invention, a stable emulsion is one which remains stable (i.e. does not separate or invert) for at least 5, and preferably 30, minutes since the washout solution is normally circulated in a processing unit which promotes re-emulsification of the mixture. A useful class of hydrotropes for aiding in emulsion formation and stabilization is the alkali metal salts of aromatic sulfonates such as potassium toluene sulfonate.

EXAMPLES

1. Use of D-Limonene

A terpene-based aqueous solvent solution was prepared in a two-step process by mixing with an air mixer in a 15 gallon container the following:
1. Premix
   2.27 kilograms of Sodium Dioctyl Sulfosuccinate
   1.13 liters of Ethyl Alcohol
2.
   39.3 liters of d-Limonene (4-isopropenyl-1-methylcylohexene)
   9.5 liters of water Total volume solution was approximately 10 gallons (39 liters)

When thoroughly mixed this mixture produced a slightly hazy, transparent emulsion. The emulsion was added to a Flex-Light ® 30"×40" rotary brush, plate processor or similar equipment. A 12"×15."×0.112" photopolymer plate based on a block copolymer of styrene and isoprene was exposed 1.5 minutes on the back with Voltarc U. V. fluorescent type lamps (with an output of 23 microwatts per $cm^2 \times 500$). The plate was then exposed through a Flex-Light ® four step test negative. The exposure steps were 4, 6, 8 and 10 minutes. The plate was subsequently washed in the wash unit with the above formulated solution for four minutes.

After wash out the plate was rinsed with fresh solution, and subsequently rinsed with water using a standard kitchen sink spray hose. After rinsing the plate was placed in a forced air drying oven at 150° F. for 1 hour. Plate quality was assessed from the finest line and half tone that could be obtained at each exposure.

This was compared to an identical plate processed with a 6 minute washout in a mixture of 75% (by volume) perchloroethylene—25% (by volume) n-butyl alcohol without the water rinse. Both plates had image relief of 30 to 35 mils. With the d-limonene emulsion, a straight 4 mil line and a satisfactory 3%, 150 line half tone was produced by the four minute exposure. The perchloroethylene—butanol mixture required 6 minutes face exposure to produce an equivalent plate quality. This superior plate quality at a shorter exposure time was a direct result of the reduced swelling in the plate produced by the terpene emulsion compared to the swelling produced by the conventional 75/25 perchloroethylene/butanol wash solution.

Additional 30"×40"×0.112" plates were processed in the terpene solvent as above until the total square feet of plate washed was approximately 25 square feet. At this point, a second 12"×15"×0.112" plate was processed as described above. Plate quality was again assessed and found to be the same as with the first plate. Additional 30"×40"×0.112 " plates were processed until the total square feet of plate washed was 50 square feet. At this point, a third 12"×15"×0.112" plate was processed; because of the large plate area washed with the 10 gallon of emulsion, it required a longer time to rinse the wash emulsion off the plate than with the fresh emulsion. However, plate quality was again assessed and found to be equivalent to the first 12"×15"×0.112" plate washed.

It was also noticed that after approximately 15 to 25 square feet of plate was processed, the emulsion tended to form two phases when allowed to stand for longer than 5 minutes without the recirculation pump of the wash unit running. This phasing tendency increased as more plates were washed. Even at 50 square feet, however, the recirculation pump could easily maintain the emulsion. This spontaneous phasing of the wash emulsion permits easy separation of the wash solution into water phase that is disposable and a solvent phase containing all the photopolymer and terpene for recovery by distillation. This results in a reduction in the volume of material that must be distilled and recycled.

When this process was repeated with the perchloroethylene—butanol wash solution it was found that it became difficult to rinse the plates after 25 to 30 square feet of plate was washed. No phasing occurred with this solvent mixture.

2. USE ON SIS PLATES

The following mixture was added to a clean Flex-Light ® 30"×40" plate processor and recirculated for 10 minutes:
33 liters of 2(2-butoxyethoxy)ethanol
67 liters of d-limonene (4-isopropenyl-1-methylcylohexene)

Photopolymer plates based on a block copolymer of styrene and isoprene were processed as in Example 1, using both this solvent and the perchloroethylene-butanol mixture as a control. Again, when processed by this solvent, the plate quality at low exposure times was equivalent to that obtained with perchloroethylene-butanol at higher times. The capacity of this was solution was also greater that the perchloroethylene-butanol mixture. No phasing of this washout solution was observed.

3. SOLVENT RECYCLING

The following added to a clean Flex-Light ® 30"×40" plate processor and recirculated for 10 minutes:
33 liters of 2(2-butoxyethoxy)ethanol
67 liters of d-limonene (4-isopropenyl-1-methylcylohexene)

Photopolymer plates based on a block copolymer of styrene and isoprene were processed as in Example 1 using this solvent. After the washout solvent was saturated with uncured photopolymer an equal amount by volume of n-butanol was added to the solution. The addition of the nonsolvent (n-butanol) produced a precipitation or flocculation of the dissolved photopolymer. The precipitate was very firm and nontacky. Because of this nontacky condition it was easy to remove the precipitated photopolymer from the solvent mixture. This solvent mixture could then be distilled to remove the n-butanol (because of the wide difference in boiling points between n-butanol and the d-limonene/2(2-butoxyethoxy)ethanol mixture) leaving the clean d-limonene/2(2-butoxyethoxy) ethanol solvent for reuse in processing more photopolymer plates. This recycle method permits wash solution recycling at a much lower volume than typical perchloroethylene/n-butanol mixtures.

When this procedure was repeated with the perchloroethylene - n-butanol mixture it was not possible to terminate the distillation on the basis of temperature because perchloroethylene and n-butanol have similar boiling points.

4. USE OF BENZYL ALCOHOL AS A NON-SOLVENT

The following was added to a clean Flex-Light ® 30"×40" plate processor and recirculated for 10 minutes:
33 liters of benzyl alcohol
67 liters of d-limonene (4-isopropenyl-1-methylcylohexene)

Photopolymer plates based on a block copolymer of styrene and isoprene were again processed as in Example 1 with this solvent. Again the plate quality was superior that obtained with perchloroethylene-butanol. The total processing capacity of this solution was also greater than that of the perchloroethylene - butanol mixture. No phasing of this solution was observed.

5. SEPARATION OF POLYMER

The following was added to a clean Flex-Light ® 30"×30 40" plate processor and recirculated for 10 minutes:
28 liters of 25% (by weight) aqueous potassium toluene sulfonate
33 liters of benzyl alcohol
64 liters of d-limonene (4-isopropenyl-1-methylcylohexene)
5 Kg OT-100 (Dioctyl sodium sulfosuccinate)

Photopolymer plates based on a block copolymer of styrene and isoprene were again processed as in Example 1 with this solvent. Again the plate quality was superior that obtained with perchloroethylene-butanol. The total processing capacity of this solution was also greater than that of the perchloroethylene - butanol mixture.

In addition the washed out photopolymer unexpectedly tended to separate spontaneously from this solution. After standing for several hours the polymer could easily be removed from the solution with a wire screen. This allowed extended use of the washout solution because the spontaneous polymer separation prevented an excessive build up of photopolymer, allowing continued use of the solution; up to approximately 200–300 square feet of plate area could be processed without distillation. Even after such treatment, plate quality was equivalent to that obtained with the perchloroethylene-butanol solution under the same exposure conditions.

6. USE OF PURE LIMONENE ON SIS PLATES

The following was added to a clean Flex-Light® 30"×40" plate processor:
   60 liters of d-limonene (4-isopropenyl-1-methylcylohexene)

Photopolymer plates based on a block copolymer of styrene and isoprene were again processed as in Example 1 with this solvent. Wash time for these plates had to be varied from 2 minutes for plates washed at the beginning of the test to 6 minutes at the end of the test. Because of the greater solvating power of the 100% solvent there was a problem with plate swelling and loss of plate detail. Because of this exposures equivalent to those required for perchloroethylenebutanol mixture processing, were necessary to hold 0.004" lines and 3%, 150 line half tones.

7. USE ON BUTADIENE-ACRYLONITRILE PLATES

The following was added to a clean Flex-Light® 30"×40" plate processor and recirculated for 10 minutes:
   33 liters of 2(2-butoxyethoxy)ethanol
   67 liters of d-limonene (4-isopropenyl-1-methylcylohexene)

Photopolymer plates based on a block copolymer of butadiene and acrylonitrile were again processed as in Example 1 using this solvent. Wash time for this type of photopolymer was 20 minutes. Again, the plate quality was equivalent that obtained with perchloroethylene-butanol or 100% perchloroethylene solvents at much higher exposure times.

8. USE OF BENZYL ALCOHOL AS A NON-SOLVENT

The following was added to a clean Flex-Light® 30"×40" plate processor and recirculated for 10 minutes:
   33 liters of benzyl alcohol
   67 liters of d-limonene (4-isopropenyl-1-methylcylohexene)

Photopolymer plates based on a block copolymer of butadiene and acrylonitrile were processed as in Example 1 with this solution. Wash time for this type plate in this solution was 20 minutes. Again the plate quality was superior to that obtained with perchloroethylene under equivalent conditions. No phasing of this solution was observed.

9. POLYMER SEPARATION

The following was added to a clean Flex-Light®30"×40" plate processor and recirculated for 10 minutes:
   28 liters of 25% (by weight) aqueous potassium toluene sulfonate
   33 liters of benzyl alcohol
   64 liters of d-limonene (4-isopropenyl-1-methylcylohexene)
   5 Kg OT-100 (dioctyl sodium sulfocuccinate)

Photopolymer plates based on a block copolymer of butadiene and acrylonitrile were processed as in Example 1 with this solution. Wash time for this type plate in this solution was 20 minutes. Again the plate quality was superior to that obtained with perchloroethylene under equivalent conditions. In addition the washed-out (uncured) photopolymer tended to separate from this solution. After standing for several hours the polymer could easily be removed from the solution with a wire screen. This allowed extended use of the solution because the spontaneous polymer separation prevented a build up of photopolymer, permitting continued use of the solution; up to approximately 200-300 square feet of plate area could be processed without distillation. Again plate quality was equivalent to that obtained with perchloroethylene at a higher exposure time.

10. USE OF PURE LIMONENE ON BUTADIENE ACRYLONITRILE PLATES

The following was added to a clean Flex-Light® 30"×40" plate processor:
   60 liters of d-limonene (4-isopropenyl-1-methylcylohexene)

Photopolymer plates based on a block copolymer of butadiene and acrylonitrile were processed as in Example 1 with this solvent. Wash time for this type plate in this wash solution was 20 minutes. Plate exposure times equivalent to those required for perchloroethylene-butanol washed plates were necessary to hold 0.004" lines and 3%, 150 line half tones with this wash solvent.

11. USE ON TERPOLYMER PLATES

The following was added to a clean Flex-Light® 30"×40" plate processor and recirculated for 10 minutes:
   33 liters of 2(2-butoxyethoxy)ethanol
   67 liters of d-limonene (4-isopropenyl-1-methylcylohexene) Photopolymer plates based on a block terpolymer of butadiene, acrylonitrile and acrylic acid were processed as in Example 1 using this solvent. Wash time for this type of photopolymer was 16 minutes in this wash solution. Again the plate quality was equivalent that obtained with perchloroethylene at a higher exposure time.

12. USE OF BENZYL ALCOHOL AS A NON-SOLVENT

The following was added to a clean Flex-Light®30"×40" plate processor and recirculated for 10 minutes:
   33 liters of benzyl alcohol
   67 liters of d-limonene (4-isopropenyl-1-methylcylohexene)

Photopolymer plates based on a terpolymer of butadiene, acrylonitrile, and acrylic acid were processed as in Example 1 with this solvent. Wash time for this type plate in this solution was 18 minutes. Again the plate quality was superior to that obtained with perchloroethylene under the same conditions. No phasing of this solution was observed.

13. SEPARATION OF POLYMER

The following was added to a clean Flex-Light ®30"×40" plate processor and recirculated for 10 minutes:
- 28 liters 25% (by weight) aqueous potassium toluene sulfonate
- 33 liters of benzyl alcohol
- 64 liters of d-limonene (4-isopropenyl-1-methyl-cylohexene)
- 5 Kg OT-100 (dioctyl sodium sulfosuccinate)

Photopolymer plates based on a terpolymer of butadiene, acrylonitrile, and acrylic acid were processed as in Example 1 with this solvent. Wash time for this type plate in this solution was 18 minutes. Again the plate quality was superior to that obtained with perchloroethylene under the same conditions. In addition, the washed-out (uncured) photopolymer tended to separate from this washout solution. After standing for several hours the polymer could easily be removed from the solution with a wire screen. This allowed extended use of the washout solution because the spontaneous polymer separation prevented a build up of photopolymer, permitting continued use of the solution; up to approximately 200–300 square feet of plate area could be processed without distillation. Again plate quality was equivalent to that obtained with perchloroethylene at a higher exposure time.

14. USE OF PURE LIMONENE ON TERPOLYMER PLATES

The following was added to a clean Flex-Light ® 30"×40" plate processor:
- 60 liters of d-limonene (4-isopropenyl-1-methyl-cylohexene)

Photopolymer plates based on a terpolymer of butadiene, acrylonitrile and acrylic acid were processed as in Example 1 with this solvent. Wash time for this type plate in this wash solution was 16 minutes. Plate exposure times equivalent to those required for perchloroethylene-n-butanol washed plates were necessary to hold 0.004" lines and 3%, 150 line half tones with this wash solvent.

It is apparent that many modifications and variations of this invention as hereinabove set forth may be made without departing from the spirit and scope thereof. The specific embodiments described are given by way of example only and the invention is limited only by the terms of the appended claims.

What is claimed is:

1. A method of developing photopolymer plates which include portions of cured and portions of uncured photopolymer which comprises the steps of (a) developing a first such plate by applying to said plate a solvent comprising at least one terpene hydrocarbon, said solvent being applied in an amount sufficient to remove substantially all of the uncured photopolymer from said plate during the exposure of said plate to said solvent, (b) reclaiming said terpene hydrocarbon, and (c) developing a second such plate according to step (a) using a solvent comprising the reclaimed terpene hydrocarbon.

2. The method of claim 1 wherein the photopolymer plate is comprised of polystyrene-polyisoprene-polystyrene block copolymer.

3. The method of claim 1 wherein the photopolymer printing plate is comprised of polystyrene-polybutadiene-polystyrene block copolymer.

4. The method of claim 1 wherein the photopolymer printing plate is comprised of butadiene acyrlonitrile copolymer.

5. The method of claim 1 wherein the photopolymer printing plate is comprised of polyamides.

6. The method of claim 1 wherein the photopolymer printing plate is comprised of a terpolymer of butadiene, acrylonitrite, and acrylic acid.

7. The method of claim 1 wherein said terpene hydrocarbon is reclaimed by the distillation of said solvent.

8. The method of claim 7 wherein the distillation is steam distillation or vacuum distillation.

9. The method of claim 1 wherein the means for applying said solvent to said plates is selected from the group consisting of spraying, brushing, dipping, and combinations therof.

10. A method comprising the steps of applying to a photopolymer plate which includes portions of cured and portions of uncured photopolymer a solvent comprising at least one terpene hydrocarbon and one or more alcohols selected from the group consisting of ethanol, n-butanol, isopropyl alcohol, benzyl alcohol, 2-ethoxy ethanol, 2-butoxy ethanol, and 2-(2-butoxy ethoxy) ethanol in an amount sufficient to remove substantially all of the uncured photopolymer from said plate during the exposure of said plate to said solvent, adding a non-solvent for said uncured photopolymer to said solvent in an amount sufficient to flocculate said uncured photopolymer, removing the flocculated uncured photopolymer by filtration or screening, and isolating said terpene hydrocarbon by distillation.

11. The method of claim 10 wherein the non-solvent added to the solvent solution is different from the non-solvent present in the terpene/non-solvent mixture.

12. The method of claim 11 which further comprises separating the non-solvent mixture by distillation.

13. The method of claim 10 wherein the distillation is steam distillation or vacuum distillation.

14. A method comprising the steps of applying to a photopolymer plate which includes portions of cured and portions of uncured photopolymer an emulsified solvent comprising:
    (a) at least one terpene hydrocarbon;
    (b) water;
    (c) a non-solvent for said uncured photopolymer; and
    (d) an emulsifier in an amount effective to enable the formation of a homogeneous emulsion;
said solvent being applied in an amount sufficient to remove substantially all of the uncured photopolymer from said plate during the exposure of said plate to said solvent, thereby forming a solvent mixture containing said uncured photopolymer, permitting the mixture to stand for a time sufficient to permit the uncured photopolymer to flocculate and separate from the mixture, and removing the flocculated uncured photopolymer from the mixture by filtration or screening.

15. The method of claim 14 wherein the means for applying said solvent to said plates is selected from the group consisting of spraying, brushing, dipping, and combinations therof.

16. The method of claim 1 wherein said solvent comprises:
    (a) at least one terpene hydrocarbon;
    (b) water, and (c) an emulsifier in an amount sufficient to enable the formation of a homogeneous emulsion.

17. The method of claim 16 which further comprises adding to said solvent a hydrotrope in an amount effective to facilitate the formation and aid in the stabilization of the homogeneous emulsion.

18. The method of claim 16 which further comprises mixing said solvent with a predetermined amount of a non-solvent.

19. A method comprising the steps of (a) applying to a photopolymer plate which contains portions of cured and portions of uncured photopolymer a solvent comprising a terpene hydrocarbon and a first non-solvent for said uncured photopolymer in an amount sufficient to remove substantially all of said uncured photopolymer from said plate during the exposure of said plate to said solvent, thereby forming a solvent mixture containing said uncured photopolymer; (b) adding a second non-solvent for said uncured photopolymer to said mixture in an amount which causes flocculation of said uncured photopolymer; (c) removing the flocculated photopolymer from said mixture; (d) removing said second non-solvent from said mixture; and (e) applying the resultant solvent, comprising said terpene hydrocarbon and said first non-solvent to a second photopolymer plate in accordance with step (a).

20. A method of claim 19 wherein said second non-solvent is removed by distillation.

21. A method of claim 20 wherein said distillation is steam distillation or vacuum distillation.

22. A method of claim 19 wherein said terpene hydrocarbon is d-limonene.

23. A method of claim 19 wherein said first non-solvent is an alcohol.

24. A method of claim 23 wherein said alcohol is benzyl alcohol.

25. A method of claim 19 wherein said second non-solvent is an alcohol.

26. A method of claim 25 wherein said alcohol is isopropanol or n-butanol.

* * * * *